(12) United States Patent
Barber et al.

(10) Patent No.: US 7,550,236 B2
(45) Date of Patent: Jun. 23, 2009

(54) MULTI WAVELENGTH MASK FOR MULTI LAYER PRINTING ON A PROCESS SUBSTRATE

(75) Inventors: Duane B. Barber, Portland, OR (US); Phong T Do, Camas, WA (US); Douglas M. Horn, Portland, OR (US)

(73) Assignee: LSI Corporation, Milpitas, CA (US)

( * ) Notice: Subject to any disclaimer, the term of this patent is extended or adjusted under 35 U.S.C. 154(b) by 810 days.

(21) Appl. No.: 10/953,322

(22) Filed: Sep. 29, 2004

(65) Prior Publication Data
US 2006/0068299 A1    Mar. 30, 2006

(51) Int. Cl.
G03F 1/00    (2006.01)
G03F 1/14    (2006.01)

(52) U.S. Cl. ........................................................ 430/5
(58) Field of Classification Search ................ 430/5
See application file for complete search history.

(56) References Cited

U.S. PATENT DOCUMENTS

| | | | | |
|---|---|---|---|---|
| 4,686,162 A | * | 8/1987 | Stangl et al. | 430/5 |
| 5,422,205 A | * | 6/1995 | Inoue et al. | 430/5 |
| 5,501,926 A | * | 3/1996 | Cheng et al. | 430/5 |
| 5,861,226 A | * | 1/1999 | Horne et al. | 430/5 |
| 2003/0205657 A1 | * | 11/2003 | Voisin | 430/5 |
| 2004/0091791 A1 | * | 5/2004 | Barber | 430/5 |

* cited by examiner

*Primary Examiner*—Mark F Huff
*Assistant Examiner*—John Ruggles
(74) *Attorney, Agent, or Firm*—Luedeka, Neely & Graham, P.C.

(57) ABSTRACT

A mask for exposing a first layer and a second layer on a process substrate, where the first and second layers are two separate layers of an integrated circuit. The mask includes a mask substrate that is substantially completely transmissive to a first wavelength of light and a second wavelength of light. A layer of a first material is disposed on the mask substrate, where the first material is substantially opaque to the first wavelength of light. The layer of the first material is patterned for the first layer. A layer of a second material is disposed on the mask substrate, where the second material is substantially opaque to the second wavelength of light. The layer of the second material is patterned for the second layer, where the layer of the first material and the layer of the second material are aligned on the mask substrate for proper alignment of the first and second layers on the process substrate.

9 Claims, 2 Drawing Sheets

| Layer 1 Exposed? | Layer 2 Exposed? | Chrome | Film 1 | Film 2 |
|---|---|---|---|---|
| Yes | Yes | Remove | Remove | Remove |
| Yes | No | Remove | Remove | Leave Intact |
| No | Yes | Remove | Leave Intact | Remove |
| No | No | Leave Intact | Either/Easier | Either/Easier |

Fig. 4

MULTI WAVELENGTH MASK FOR MULTI LAYER PRINTING ON A PROCESS SUBSTRATE

FIELD

This invention relates to the field of integrated circuit fabrication. More particularly, this invention relates to microphotolithography.

BACKGROUND

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Integrated circuits are typically formed through a series of photolithographic processes, where photoresist is applied across the surface of the substrate on which the integrated circuits are fabricated. The photoresist is exposed with a pattern that remains in the photoresist after it is developed. Processing is then accomplished in some manner through the voids that are formed in the patterned photoresist. For example, the exposed portions of the integrated circuits being fabricated can be etched, receive deposited layers, or be doped, such as with ion implantation.

Because of the small geometries and tight tolerances of modern integrated circuits, there is a need to align one lithographic layer to another with a high degree of accuracy. One method of accomplishing this is an indirect alignment method, where for the first alignment layer, alignment reference marks on the substrate are aligned with reference marks disposed on the stage of the exposure tool. Subsequent layers are aligned by aligning the reference marks on the reticle to the reference marks on the stage of the exposure tool. The exposure is then made with the reticle being indirectly aligned.

An alternate method uses a direct alignment, where the alignment reference marks on the reticle for the second and subsequent layers are aligned directly to the reference marks that were formed on the substrate when the first layer was printed. The exposure is then made with the reticle being directly aligned. With either of these two methods, after the alignment is performed, the alignment results can be augmented with second order corrections that are determined from overlay measurements of previous substrates.

The approaches described above focus on aligning reference marks on the substrate, such as from the first layer, to reference marks on the reticle, for the second and subsequent layers, either directly or indirectly. This is typically limited to a very small number of reference marks when augmentation is not used. When augmentation is used, the number of reference marks may be extended to a number of marks that covers the exposure field corners at multiple sites across the substrate, and may additionally include a mark at the field center.

However, each of the cases described are generally limited to a fairly modest number of points that are aligned. For layers that do not have demanding overlay requirements, such a low number of alignment marks may be adequate. However, there tends to be inherent errors between the reticles used for the first layer and those used for the second and subsequent layers. This includes differences in where the alignment marks are placed with respect to each other, differences in where the alignment marks are placed with respect to the circuit pattern, and differences in the internal layout of the circuit pattern. When overlay demands become very stringent, these inherent errors can start to consume a significant portion of the overlay budget.

What is needed, therefore, is a system that overcomes problems such as those described above, at least in part.

SUMMARY

The above and other needs are met by a mask for exposing a first layer and a second layer on a process substrate, where the first and second layers are two separate layers of an integrated circuit. The mask includes a mask substrate that is substantially completely transmissive to at least a first wavelength of light and a second wavelength of light. A layer of a first material is disposed on the mask substrate, where the first material is substantially opaque to the first wavelength of light. The layer of the first material is patterned for the first layer. A layer of a second material is disposed on the mask substrate, where the second material is substantially opaque to the second wavelength of light. The layer of the second material is patterned for the second layer, where the first layer and the second layer are aligned on the mask substrate.

In this manner, the mask according to the present invention is patterned with and can be used for two separate mask layers of an integrated circuit. In so doing, any of the inherent alignment problems between the two mask layers are removed, as the two mask layers reside on the same substrate, and are already aligned one to another. Thus, common alignment marks can be used for aligning the mask to the substrate for each of the two or more layers that are patterned on the substrate, and at least one detrimental source of alignment error is removed from the process.

In this manner, the mask according to the present invention is patterned with and can be used for two separate mask layers of an integrated circuit. In so doing, any of the inherent alignment problems between the two mask layers are removed, as they two mask layers reside on the same substrate, and are already aligned one to another. Thus, common alignment marks can be used for aligning the mask to the substrate for each of the two or more layers that are patterned on the substrate, and at least one detrimental source of alignment error is removed from the process.

In various embodiments of this aspect of the invention, a layer of a third material is also disposed on the mask substrate, where the third material is substantially opaque to at least both the first wavelength of light and the second wavelength of light. The layer of the third material is patterned for a union of both the first layer and the second layer.

In some embodiments, a layer of a third material is disposed on the mask substrate, where the third material is substantially opaque to a third wavelength of light. The layer of the third material is patterned for a third layer, and the mask is adapted for additionally exposing the third layer on the process substrate. The first, second, and third layers are three separate layers of the integrated circuit. The mask substrate is additionally substantially completely transmissive to the third wavelength of light.

In various embodiments the mask substrate is formed of quartz or sapphire. The layer of the first material or the layer of the second material may be patterned for either a positive photoresist or a negative photoresist.

According to another aspect of the invention there is described a mask for exposing a first layer and a second layer on a process substrate, where the first and second layers are two separate layers of an integrated circuit, and the second layer is a subset of the first layer. By subset it is meant that there are no portions of the second layer to be exposed that do not lie within portions of the first layer to be exposed. The mask includes a mask substrate formed of quartz, where the mask substrate is substantially completely transmissive to a first wavelength of light and a second wavelength of light. A layer of a first material is disposed on the mask substrate. The first material is substantially opaque to both the first wavelength of light and the second wavelength of light, and the layer of the first material is patterned for the first layer. A layer of a second material is also disposed on the mask substrate. The second material is substantially opaque to the second wavelength of light, and the layer of the second material is patterned for the second layer. The first layer and the second layer are aligned on the mask substrate.

In various embodiments of this aspect of the invention, a layer of a third material is disposed on the mask substrate. The third material is substantially opaque to a third wavelength of light, and the layer of the third material is patterned for a third layer. The mask is adapted for additionally exposing the third layer on the process substrate. The first, second, and third layers are three separate layers of the integrated circuit, and the first, second, and third layers are aligned on the mask substrate.

According to yet another aspect of the invention there is described a method for exposing a first layer and a second layer on a process substrate, where the first and second layers are two separate layers of an integrated circuit. The process substrate is processed in preparation for the first layer, and aligned to a mask for forming the first layer. The first layer is exposed with a first wavelength of light through the mask. The mask is patterned with a first material that is substantially transmissive to all wavelengths of light except for the first wavelength of light, thereby blocking selected portions of the first wavelength of light from passing through the mask. The process substrate is processed according to the first layer, and also in preparation for the second layer.

The process substrate is aligned to the mask for forming the second layer. The second layer is exposed with a second wavelength of light through the mask. The mask is patterned with a second material that is substantially transmissive to all wavelengths of light except for the second wavelength of light, thereby blocking selected portions of the second wavelength of light from passing through the mask. The first layer and the second layer are aligned on the mask substrate. The process substrate is processed according to the second layer.

In various embodiments, this aspect of the invention includes processing the process substrate in preparation for a third layer. The third layer is exposed with a third wavelength of light through the mask. The mask is patterned with a third material that is substantially transmissive to all wavelengths of light except for the third wavelength of light, thereby blocking selected portions of the third wavelength of light from passing through the mask. The process substrate is processed according to the third layer. In other embodiments, the mask is patterned with a third material that is substantially opaque to all wavelengths of light. The third material is patterned for a union of all layers present on the mask.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 4 is a table of how the combined mask of FIG. 3 is to be configured for different embodiments.

DETAILED DESCRIPTION

This invention relates to a method for printing two different lithographic layers using a single reticle that has patterns for different layers of the integrated circuit superimposed and aligned on top of one another on the same mask substrate. This is preferably accomplished by using two different wavelengths of light for the exposure, where a different one of the two wavelengths is used for each layer. In this manner the two patterns for the two layers can be superimposed on a single reticle, preferably minimizing and most preferably eliminating many of the overlay errors inherent in using two separate reticles. This permits tighter overlay performance to be achieved.

This method requires that two different exposure wavelengths be available. Likely wavelength pairings based on currently available exposure tools are 193 nanometers for one layer and 248 nanometers for the other layer, or 248 nanometers for one layer and 365 nanometers for the other layer. Once the wavelengths that are to be used are determined, the next step is to modify the reticle design so that, for a given layer, the appropriate wavelength of light is transmitted through only those portions of the combined mask that correspond to the pattern for that layer, and is reflected or absorbed everywhere else.

This wavelength selectivity may be achieved, in one embodiment, by coating the reticle with one or more optical films tailored to be transmissive in one wavelength range and reflective or absorptive in the other wavelength range. Producing such films is a standard technique in the optics industry, and very high quality films are readily available for such purposes. Furthermore, reticle manufacturers have developed the ability to pattern and etch thin films deposited onto reticle substrates, as such thin films that are designed to alter optical path lengths have been accepted with the emergence of phase-shifting reticle technology. Therefore, the building blocks needed to implement this invention are available.

A simple embodiment of the present invention is that of a hole layer aligning to a line layer (or vice-versa), in which all hole positions on one layer coincide with a line on the other layer. This tends to be a fairly common case in integrated circuit fabrication. For this case, only one wavelength-selective thin film is required if appropriate choices of resists are made. In this example, the line layer is preferably patterned using a negative resist, so that the resist is developed away where no exposure occurs, and patterned lines of photoresist are left on the substrate where the resist is exposed through the mask.

Figure 1:
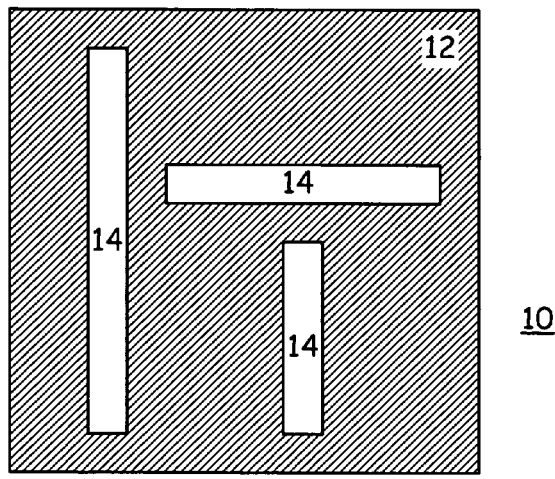
FIG. 1 is a top plan view of a mask for a line layer with negative photoresist.
Figure 2:
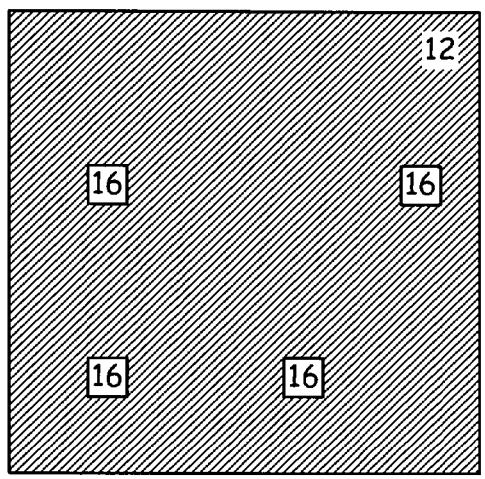
FIG. 2 is a top plan view of a mask for a hole layer with positive photoresist.

By contrast, the hole layer in this example is preferably patterned using a positive resist, so that resist remains on the substrate unless it is exposed to light through the mask, and holes are formed where the resist is exposed to the light. This example is illustrated in FIGS. 1 and 2 below. The line layer as depicted in FIG. 1 is patterned in the chrome 12 of the reticle 10, where the chrome 12, or other material so employed, is substantially opaque to all wavelengths of light.

The chrome 12 is removed from those portions 14 where the lines are to be formed. For a second reticle 10 as depicted in FIG. 2, the hole layer is patterned in the chrome 12 such that the chrome 12 is removed only where the holes 16 will exist.

According to the present invention, however, the reticle 10 with the chrome 12 patterned for the lines 14 is coated with a film 22 which is substantially opaque to the wavelength used for the hole 16 layer, but substantially transmissive at the wavelength used for the line 14 layer. Thus, the film 22 preferably has essentially no impact on the light transmitted through the mask 10 for the line 14 layer, but preferably blocks substantially all of the light as appropriate for the hole 16 layer.

Figure 3:
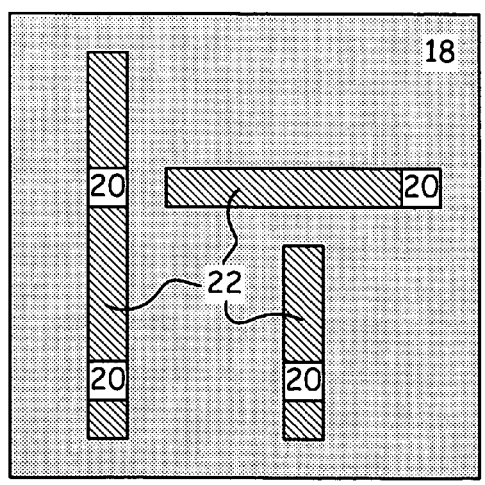
FIG. 3 is a top plan view of a combined mask for both the line and the hole layers.

The wavelength-selective film 22 is patterned with the pattern for the hole 16 layer, such that the film 22 is etched away wherever a hole 16 is to be formed, and remains everywhere else, as depicted in FIG. 3. Again, this step has no impact on the light that is to be transmitted through the openings for the line 14 layer, but now light will correctly expose the holes 16 for the hole layer. As depicted in FIG. 3, portions 18 of the reticle 10 preferably include both chrome 12 and the layer 22, but may in alternate embodiments include just the chrome 12, which blocks the radiation in both of the selected wavelengths. Regions 22 preferably include just the film that blocks one of the wavelengths, and regions 20 are transmissive to both of the wavelengths. Thus, FIG. 3 depicts a single reticle 10 that can be used to print two different layers, which reduces and preferably eliminates overlay errors between these layers.

The above example is one of the simplest scenarios. In cases where different resist tonalities are desired, or where one layer's pattern does not always fall entirely upon another layer's pattern, it may be desirable to use a second wavelength-selective film, so that one film is available which reflects or absorbs each of the two wavelengths used, while at the same time transmitting the other wavelength. With two films in use, the chrome 12 is preferably first patterned to cover all those portions of the reticle 10 in which no transmission of light is desired for either of the two patterns. However, as describe below, this step may be omitted in some embodiments.

Next, one film is deposited, patterned, and etched, and then the second film is deposited, patterned, and etched. This more complex scenario is not as easy to illustrate with figures as the above case, but the scheme in determining how to pattern the optional chrome and the films is straightforward, as shown in the table of FIG. 4. This table depicts how any given spot on the mask should be configured given the desired exposure or non-exposure performance from that spot for each layer. "Film 1" is substantially opaque to the wavelength of light used to expose layer 1, and "Film 2" is substantially opaque to the wavelength of light used to expose layer 2.

As indicated in the table of FIG. 4, the chrome 12 is preferably removed from all those portions of the mask 10 where an exposure of one or both of the two wavelengths of light is to be made. The table indicates that there are specific regions where one or both of the wavelength selective films are to be either removed from the mask 10 or left intact on the mask 10. In portions where the chrome 12 is left intact, it is immaterial whether one or both of the wavelength selective films are either left intact or removed, and therefore the easier of the two options may be selected independently for each of the two layers. However, if both layers are left intact in those portions, then the chrome layer 12 can be eliminated altogether, which in some embodiments may enable the fabrication of the mask 10 to be either simplified or reduced in cost.

By following this strategy, any two or more layers with a tight overlay requirement may be combined onto a single mask. The resulting mask may well be more expensive to produce than a conventional mask, due to the extra processing involved. However, for cases where overlay tolerance is critical, this method and mask structure offers a unique means of reducing overlay errors and improving the associated yield and performance metrics. It is appreciated this method can be extended to more than two mask layers by using more than two wavelengths of light and more than two wavelength selective films for forming the patterns on the mask 10.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A mask for exposing a first layer and a second layer on a process substrate, where the first and second layers are two separate layers of an integrated circuit, the mask comprising:
    a mask substrate, where the mask substrate is substantially completely transmissive to a first wavelength of light and a second wavelength of light,
    a layer of a first material disposed on the mask substrate, where the first material is substantially opaque to the first wavelength of light and substantially transmissive to the second wavelength of light, and the layer of the first material is patterned for the first layer, and
    a layer of a second material disposed on the mask substrate, where the second material is substantially transmissive to the first wavelength of light and substantially opaque to the second wavelength of light, and the layer of the second material is patterned for the second layer, where the layer of the first material and the layer of the second material are aligned on the mask substrate for proper alignment of the first and second layers on the process substrate.

2. The mask of claim 1, further comprising a layer of a third material disposed on the mask substrate, where the third material is substantially opaque to both the first wavelength of light and the second wavelength of light, and the layer of the third material is patterned for a union of both the first layer and the second layer.

3. The mask of claim 1, further comprising a layer of a third material disposed on the mask substrate, where the third material is substantially opaque to a third wavelength of light, and the layer of the third material is patterned for a third layer, and the mask is adapted for additionally exposing the third layer on the process substrate, where the first, second, and third layers are three separate layers of the integrated circuit, the mask substrate is additionally substantially completely transmissive to the third wavelength of light, where the first, second, and third layers are all aligned on the mask substrate.

4. The mask of claim 1, wherein the mask substrate is formed of quartz.

5. The mask of claim 1, wherein the mask substrate is formed of sapphire.

6. The mask of claim 1, wherein the layer of the first material is patterned for a positive photoresist.

7. The mask of claim 1, wherein the layer of the first material is patterned for a negative photoresist.

8. The mask of claim 1, wherein the layer of the second material is patterned for a positive photoresist.

9. The mask of claim 1, wherein the layer of the second material is patterned for a negative photoresist.

* * * * *